(12) United States Patent
Jung et al.

(10) Patent No.: US 11,935,867 B2
(45) Date of Patent: Mar. 19, 2024

(54) SEMICONDUCTOR PACKAGE WITH MEMORY STACK STRUCTURE CONNECTED TO LOGIC DIES VIA AN INTERPOSER

(71) Applicant: Samsung Electronics Co., Ltd., Suwon-si (KR)

(72) Inventors: Yanggyoo Jung, Gwangmyeong-si (KR); Sungeun Kim, Asan-si (KR); Sangmin Yong, Seongnam-si (KR); Hae-Jung Yu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/398,406

(22) Filed: Aug. 10, 2021

(65) Prior Publication Data
US 2022/0189916 A1 Jun. 16, 2022

(30) Foreign Application Priority Data
Dec. 14, 2020 (KR) ........................ 10-2020-0174388

(51) Int. Cl.
*H01L 25/065* (2023.01)
*H01L 23/00* (2006.01)
(Continued)

(52) U.S. Cl.
CPC ...... *H01L 25/0652* (2013.01); *H01L 23/5383* (2013.01); *H01L 23/642* (2013.01); *H01L 24/16* (2013.01); *H01L 24/17* (2013.01); *H01L 24/32* (2013.01); *H01L 24/73* (2013.01); *H01L 2224/16145* (2013.01); *H01L 2224/16227* (2013.01); *H01L 2224/17181* (2013.01); *H01L 2224/32145* (2013.01);
(Continued)

(58) Field of Classification Search
CPC ....... H01L 23/642; H01L 24/16; H01L 24/17; H01L 24/32
USPC ........................................................ 257/773
See application file for complete search history.

(56) References Cited

U.S. PATENT DOCUMENTS 9,385,056 B2   7/2016   Hu et al.
9,806,061 B2   10/2017  Shen
(Continued)

FOREIGN PATENT DOCUMENTS

JP    5396508 B2       1/2014
JP    2016058472 A     4/2016
KR    1020160122437 A  10/2016

*Primary Examiner* — Nduka E Ojeh
*Assistant Examiner* — Laura M Dykes
(74) *Attorney, Agent, or Firm* — Muir Patent Law, PLLC

(57) ABSTRACT

A semiconductor package comprising a package substrate that extends in a first direction and a second direction perpendicular to the first direction, a plurality of logic dies and a memory stack structure on the package substrate, and an interposer substrate mounted in the package substrate. The memory stack structure vertically overlaps the interposer substrate. Each of the logic dies includes a first part that is horizontally offset from the interposer substrate and a second part that vertically overlaps the interposer substrate. The interposer substrate includes an interlayer dielectric layer and a plurality of wiring lines in the interlayer dielectric layer. The memory stack structure is electrically connected to at least one of the logic dies through the wiring lines of the interposer substrate.

20 Claims, 8 Drawing Sheets

(51) Int. Cl.
*H01L 23/538* (2006.01)
*H01L 23/64* (2006.01)

(52) U.S. Cl.
CPC ............... *H01L 2224/32225* (2013.01); *H01L 2224/73204* (2013.01); *H01L 2225/06513* (2013.01); *H01L 2225/06517* (2013.01); *H01L 2924/3511* (2013.01)

(56) References Cited

U.S. PATENT DOCUMENTS

| | | |
|---|---|---|
| 10,020,267 B2 | 7/2018 | Rahman et al. |
| 10,026,720 B2 | 7/2018 | Yazdani |
| 10,199,319 B2 | 2/2019 | Shim et al. |
| 2010/0081236 A1 | 4/2010 | Yang et al. |
| 2011/0089573 A1* | 4/2011 | Kurita ................ H01L 25/18 |
| | | 438/106 |
| 2015/0250058 A1* | 9/2015 | Ramachandran ... H01L 27/0688 |
| | | 361/748 |
| 2016/0073515 A1 | 3/2016 | Shimizu et al. |
| 2017/0062383 A1* | 3/2017 | Yee ................ H01L 23/49838 |
| 2018/0175001 A1* | 6/2018 | Pyo ................... H01L 21/4857 |
| 2019/0363049 A1* | 11/2019 | Mekonnen ............ H01L 21/486 |
| 2020/0075567 A1* | 3/2020 | Collins ................ H01L 25/50 |
| 2020/0098725 A1* | 3/2020 | Liff ..................... H01L 24/16 |
| 2020/0381350 A1* | 12/2020 | Sharan ................. H01L 24/16 |
| 2021/0257272 A1* | 8/2021 | Kothari ............... H01L 23/3736 |

\* cited by examiner

SEMICONDUCTOR PACKAGE WITH MEMORY STACK STRUCTURE CONNECTED TO LOGIC DIES VIA AN INTERPOSER

CROSS-REFERENCE TO RELATED APPLICATION

This U.S. nonprovisional application claims priority under 35 U.S.C § 119 to Korean Patent Application No. 10-2020-0174388 filed on Dec. 14, 2020 in the Korean Intellectual Property Office, the disclosure of which is hereby incorporated by reference in its entirety.

BACKGROUND

The present inventive concepts relate to a semiconductor package, and more particularly to, a semiconductor package including an interposer substrate mounted in a package substrate.

In the semiconductor industry, high capacity, thinness, and small size of semiconductor devices and electronic products using the same have been demanded and thus various package techniques have been suggested. A semiconductor package is provided to implement an integrated circuit chip for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, electronic products having increasingly high performance, high speed, and compact size are in demand.

SUMMARY

Some embodiments of inventive concepts provide a semiconductor package having increased reliability.

According to some embodiments of the present inventive concepts, a semiconductor package may comprise: a package substrate that extends in a first direction and a second direction perpendicular to the first direction; a plurality of logic dies and a memory stack structure on the package substrate; and an interposer substrate mounted in the package substrate. The memory stack structure may vertically overlap the interposer substrate. Each of the logic dies may include: a first part that is horizontally offset from the interposer substrate; and a second part that vertically overlaps the interposer substrate. The interposer substrate may include: an interlayer dielectric layer; and a plurality of wiring lines in the interlayer dielectric layer. The memory stack structure may be electrically connected to at least one of the logic dies through the wiring lines of the interposer substrate.

According to some embodiments of the present inventive concepts, a semiconductor package may comprise: a package substrate that extends in a first direction and a second direction perpendicular to the first direction and that includes, when viewed in plan, a plurality of edge regions and a central region between the edge regions; a plurality of logic dies and a memory stack structure on the package substrate, the logic dies being on the edge regions, and the memory stack structure being on the central region; an interposer substrate mounted in the package substrate, the interposer substrate electrically connecting the memory stack structure to at least one of the logic dies; a plurality of first connection terminals that electrically connect the logic dies to the package substrate; a plurality of second connection terminals that electrically connect the logic dies to the interposer substrate; and a plurality of third connection terminals that electrically connect the memory stack structure to the interposer substrate. A pitch between the first connection terminals may be greater than a pitch between the second connection terminals. The pitch between the first connection terminals may be greater than a pitch of the third connection terminals.

According to some embodiments of the present inventive concepts, a semiconductor package may comprise: a package substrate that extends in a first direction and a second direction perpendicular to the first direction and that includes a plurality of edge regions and a central region between the edge regions; an interposer substrate mounted in the package substrate; a dielectric film between the package substrate and the interposer substrate; a plurality of logic dies on the edge regions of the package substrate; a memory stack structure on the central region of the package substrate, the memory stack structure including a buffer die and a plurality of memory dies that are stacked on the buffer die; a plurality of first connection terminals between the package substrate and the logic dies; a plurality of second connection terminals between the interposer substrate and the logic dies; a plurality of third connection terminals between the memory stack structure and the interposer substrate; a plurality of pads on lower portions of the first, second, and third connection terminals; an under-fill layer that encapsulates the first, second, and third connection terminals; and a plurality of external terminals on a bottom surface of the package substrate. The interposer substrate may include: a base substrate; an interlayer dielectric layer on the base substrate; a plurality of wiring lines in the interlayer dielectric layer; and a plurality of vias in the interlayer dielectric layer, the plurality of vias electrically connecting the wiring lines to each other. The memory stack structure and at least one of the logic dies may be electrically connected to each other through the wiring lines of the interposer substrate. The memory stack structure may vertically overlap the interposer substrate. Each of the logic dies may include: a first part that is horizontally offset from the interposer substrate; and a second part that vertically overlaps the interposer substrate.

DETAILED DESCRIPTION OF EMBODIMENTS

Figure 1:
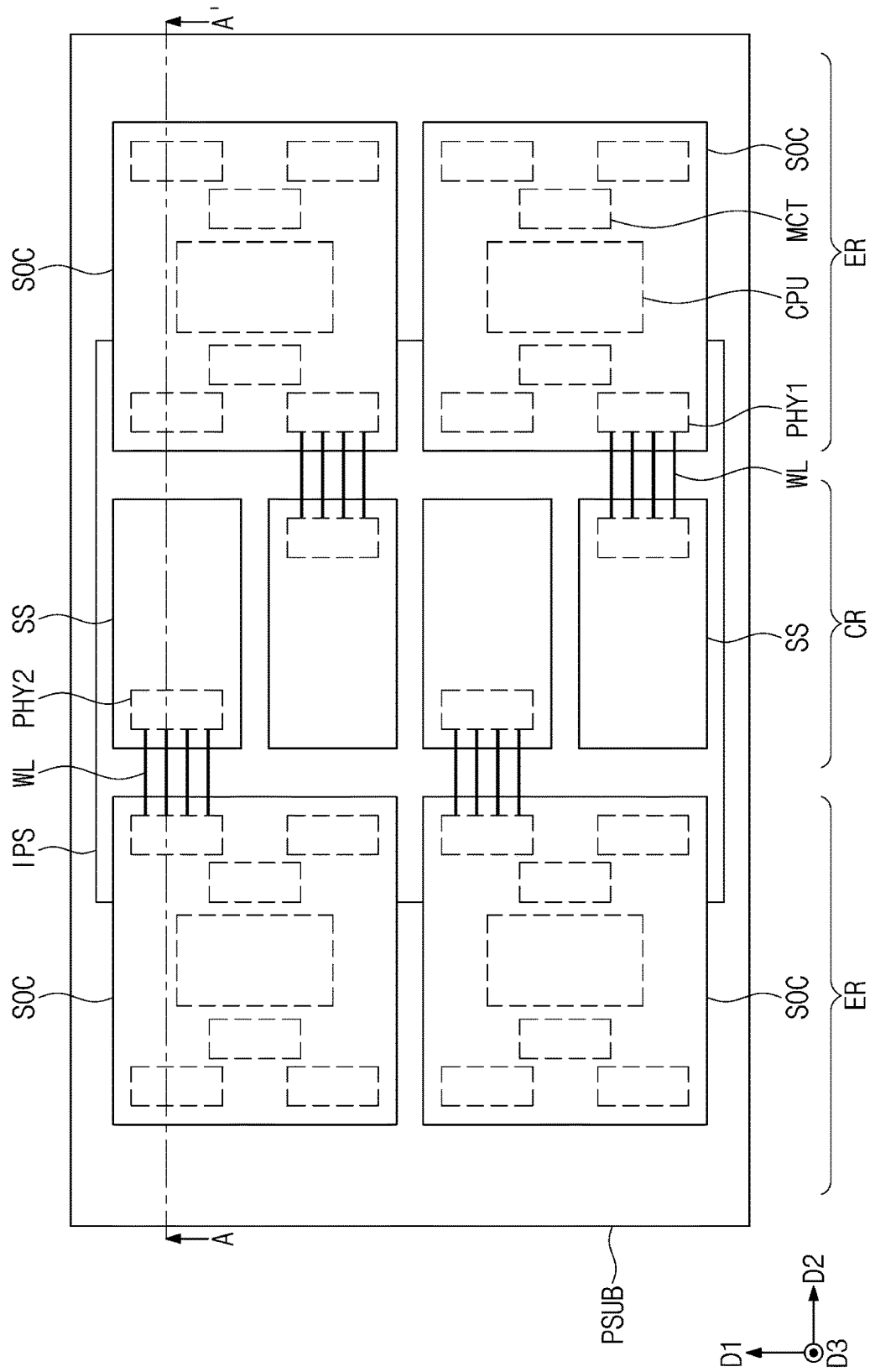
FIG. 1 illustrates a plan view showing a semiconductor package according to some embodiments of the present inventive concepts.
Figure 2:
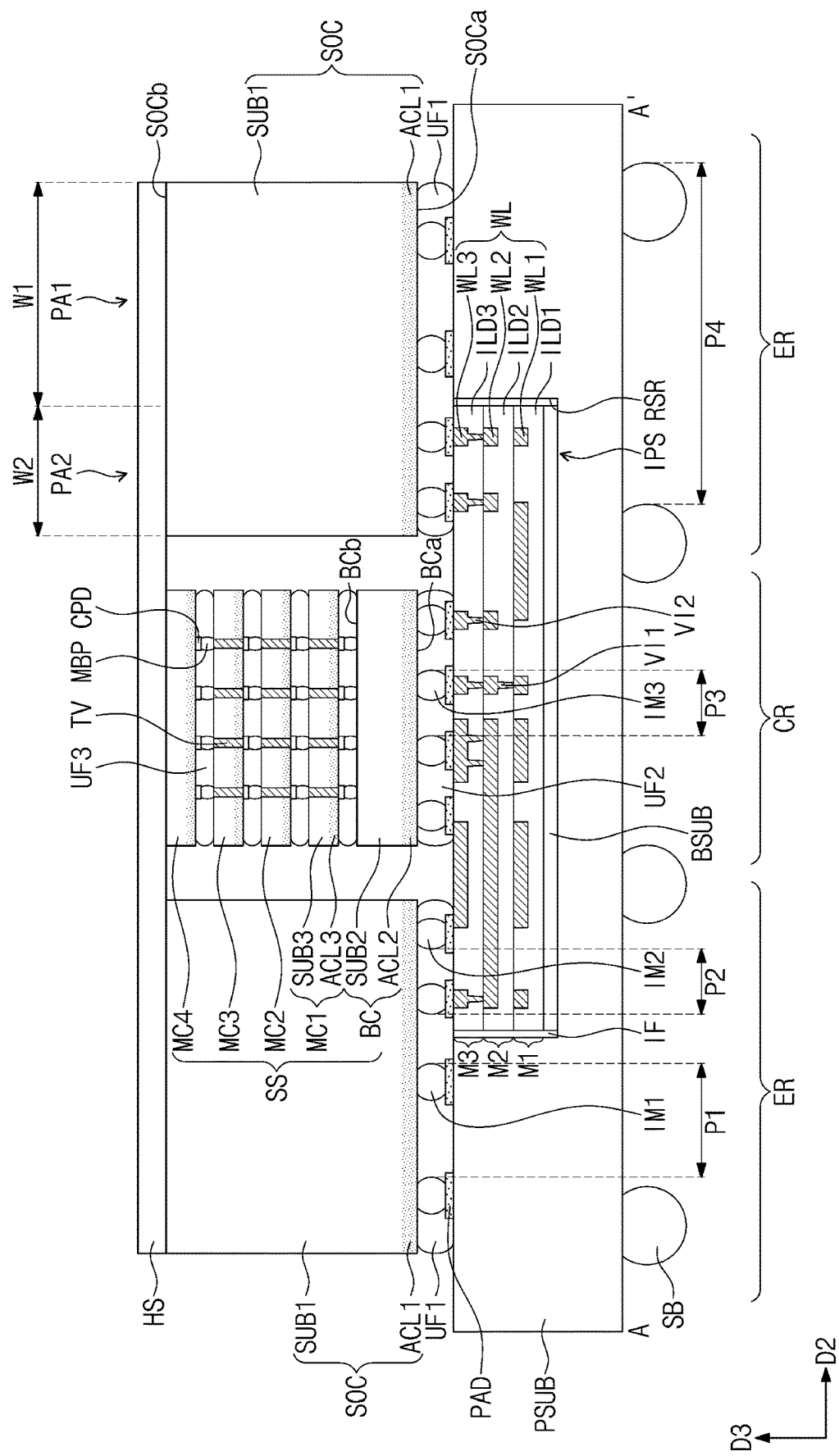
FIG. 2 illustrates a cross-sectional view taken along line A-A' of FIG. 1.

FIG. 1 illustrates a plan view showing a semiconductor package according to some embodiments of the present inventive concepts. FIG. 2 illustrates a cross-sectional view taken along line A-A' of FIG. 1.

Referring to FIGS. 1 and 2, a package substrate PSUB may be provided. For example, the package substrate PSUB may be a printed circuit board (PCB). The package substrate PSUB may include edge regions ER and a central region CR between the edge regions ER. The edge regions ER may be areas positioned at opposite ends of the package substrate PSUB. The central region CR may be an area positioned at a central portion of the package substrate PSUB. The edge regions ER may be spaced apart from each other in a second direction D2.

The package substrate PSUB may include a recess region RSR. The recess region RSR of the package substrate PSUB may be an area that is recessed from a top surface of the package substrate PSUB. The recess region RSR of the package substrate PSUB may be positioned on the central portion of the package substrate PSUB.

An interposer substrate IPS may be mounted in the recess region RSR of the package substrate PSUB. The interposer substrate IPS may be inserted into the recess region RSR of the package substrate PSUB. For example, the interposer substrate IPS may be a redistribution substrate. The interposer substrate IPS may be a silicon interposer substrate formed by using a semiconductor substrate. The interposer substrate IPS may have a top surface at substantially the same level as that of the top surface of the package substrate PSUB. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The interposer substrate IPS may be mounted in the recess region RSR of the package substrate PSUB of a semiconductor package according to some embodiments of the present inventive concepts, and thus the semiconductor package may decrease in thickness.

The interposer substrate IPS may include a base substrate BSUB. The base substrate BSUB may be a semiconductor substrate (e.g., silicon substrate). The interposer substrate IPS may include wiring lines WL. The wiring lines WL may include first wiring lines WL1, second wiring lines WL2, and third wiring lines WL3. A metal layer M1, a second metal layer M2, and a third metal layer M3 may be sequentially stacked on the base substrate BSUB. The first metal layer M1 may include a first interlayer dielectric layer ILD1 and the first wiring lines WL1. The second metal layer M2 may include a second interlayer dielectric layer ILD2 and the second wiring lines WL2. The third metal layer M3 may include a third interlayer dielectric layer ILD3 and the third wiring lines WL3. For example, each of the first, second, and third interlayer dielectric layers ILD1, ILD2, and ILD3 may include or may be formed of silicon oxide.

The second metal layer M2 may further include first vias VI1 below the second wiring lines WL2. The first vias VI1 may be interposed between the first wiring lines WL1 and the second wiring lines WL2. The third metal layer M3 may further include second vias VI2 below the third wiring lines WL3. The second vias VI2 may be interposed between the second wiring lines WL2 and the third wiring lines WL3. The second metal layer M2 may be electrically connected through the first vias VI1 to the first metal layer M1. The third metal layer M3 may be electrically connected through the second vias VI2 to the second metal layer M2. For example, the first, second, and third wiring lines WL1, WL2, and WL3, the first vias VI1, and the second vias VI2 may each include or may be formed of a metallic material, such as one or more of copper, aluminum, tungsten, and titanium.

No through via (e.g., through silicon via or TSV) may be included in the interposer substrate IPS of a semiconductor package according to some embodiments of the present inventive concepts. Therefore, it may be possible to simplify fabrication processes of the semiconductor package and as a result to cut fabrication costs of the semiconductor package. A used herein, a through via (e.g., through silicon via or TSV) refers to a vertical electrical connection that passes completely through the interposer substrate IPS (i.e., the first metal layer M1, the second metal layer M2, the third metal layer M3, and the base substrate BSUB).

A dielectric film IF may be interposed between the package substrate PSUB and the interposer substrate IPS. The dielectric film IF may be provided on a sidewall of the recess region RSR. For example, an ajinomoto build-up film (ABF) or a non-conductive film (NCF) may be used as the dielectric film IF.

External terminals SB may be provided on a bottom surface of the package substrate PSUB. For example, the external terminals SB may include solder balls. Although not shown, the package substrate PSUB may include therein routing lines and at least one via.

Logic dies SOC and memory stack structures SS may be mounted on the package substrate PSUB. The logic dies SOC may be disposed on the edge regions ER, and the memory stack structures SS may be disposed on the central region CR. As the memory stack structures SS are disposed on the central region CR of the package substrate PSUB, the package substrate PSUB may be prevented from warpage. As a result, a semiconductor package may increase in reliability.

For example, four memory stack structures SS may be disposed on the central region CR, and four logic dies SOC may be disposed on the edge regions ER. The present inventive concepts, however, are not limited thereto, and the number of the memory stack structures SS and that of the logic dies SOC may be variously changed. The memory stack structures SS may be arranged in a first direction D1, perpendicular to the second direction D2. The logic dies SOC may be arranged in the first direction D1 on the edge region ER (see FIG. 1). When viewed in plan, the memory stack structures SS may be disposed between the logic dies SOC. A plurality of memory stack structures SS may be disposed between the logic dies SOC that are adjacent to each other in the second direction D2. The memory stack structures SS may vertically overlap the interposer substrate IPS. The memory stack structure SS may have a planar size less than that of the logic die SOC. Also, the memory stack structure SS may be electrically connected through the wiring lines WL to a single logic die SOC.

The logic die SOC may include a central processing unit CPU, a first physical-layer interface region PHY1, and a memory controller MCT. For example, the logic die SOC may be a system-on-chip. The logic die SOC may have a first surface SOCa that faces the package substrate PSUB and a second surface SOCb opposite to the first surface SOCa. The logic die SOC may include a first substrate SUB1 and a first active layer ACL1 on the first substrate SUB1. The first active layer ACL1 may be adjacent to the first surface SOCa. The first substrate SUB1 may be adjacent to the second surface SOCb.

The first active layer ACL1 may include transistors formed on the first substrate SUB1 and a wiring layer on the transistors. The transistors of the first active layer ACL1 may constitute a logic circuit. The logic die SOC may be mounted on the package substrate PSUB such that the logic die SOC may have a face down state in which the first active layer ACL1 faces the package substrate PSUB.

The logic die SOC may include a first part PA1 that is horizontally offset from the interposer substrate IPS in the second direction and a second part PA2 that vertically overlaps the interposer substrate IPS in a third direction D3, which is perpendicular to the first direction D1 and the second direction D2. The first part PA1 may have a first width W1 in the second direction, and the second part PA2 may have a second width W2 in the second direction. The first width W1 may be greater than the second width W2. For example, the second width W2 may have a value selected from a range from about 0.5 mm to about 5 mm.

Each of the plurality of memory stack structures SS may have substantially the same structure. The following will discuss in detail one of the plurality of memory stack structures SS. The memory stack structure SS may include a buffer die BC and first to fourth memory dies MC1 to MC4 that are sequentially stacked on the buffer die BC.

The buffer die BC may have a first surface BCa that faces the interposer substrate IPS and a second surface BCb opposite to the first surface BCa. The buffer die BC may include a second substrate SUB2 and a second active layer ACL2 on the second substrate SUB2. The second active layer ACL2 may be adjacent to the first surface BCa. The second substrate SUB2 may be adjacent to the second surface BCb.

The second active layer ACL2 may include transistors formed on the second substrate SUB2 and a wiring layer on the transistors. The transistors of the second active layer ACL2 may constitute an integrated circuit. The buffer die BC may be mounted on the interposer substrate IPS such that the buffer die BC may have a face down state in which the second active layer ACL2 faces the interposer substrate IPS.

First connection terminals IM1 may be provided between the logic die SOC and the package substrate PSUB. Second connection terminals IM2 may be provided between the logic die SOC and the interposer substrate IPS. Third connection terminals IM3 may be provided between the interposer substrate IPS and the buffer die BC of the memory stack structure SS. For example, each of the first, second, and third connection terminals IM1, IM2, and IM3 may be a micro-bump. The logic die SOC may be flip-chip mounted through the first and second connection terminals IM1 and IM2 on the package substrate PSUB and the interposer substrate IPS. The buffer die BC may be flip-chip mounted through the third connection terminals IM3 on the interposer substrate IPS.

The first, second, and third connection terminals IM1, IM2, and IM3 may have pads PAD provided on lower portions thereof. For example, the pads PAD may include or may be formed of a metallic material. Although not shown, the first connection terminals IM1 may be electrically connected to routing lines in the package substrate PSUB. At least one logic die SOC and the memory stack structure SS may be electrically connected to each other through the interposer substrate IPS. For example, at least one logic die SOC and the memory stack structure SS may be electrically connected to each other through the wiring lines WL in the interposer substrate IPS.

The memory stack structure SS of a semiconductor package according to the present inventive concepts may be electrically connected to the logic die SOC by the interposer substrate IPS and the logic die SOC may be electrically connected to the package substrate PSUB. Thus, an electrical connection may be omitted between the interposer substrate IPS and the package substrate PSUB. Alternatively, the interposer substrate IPS and the package substrate PSUB may be electrically connected to each other.

A first pitch P1 may be provided between the first connection terminals EVIL A second pitch P2 may be provided between the second connection terminals IM2. A third pitch P3 may be provided between the third connection terminals IM3. A fourth pitch P4 may be provided between the external terminals SB. The first pitch P1 may be greater than the second pitch P2. The first pitch P1 may be greater than the third pitch P3. The second pitch P2 may be substantially the same as the third pitch P3. For example, the first pitch P1 may have a value selected from a range from about 50 μm to about 200 μm. The second and third pitches P2 and P3 may each have a value selected from a range from about 40 μm to about 50 μm. The fourth pitch P4 may be greater than the first pitch P1. For example, the fourth pitch P4 may be equal to or greater than about 500 Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

A first under-fill layer UF1 may be provided between the logic die SOC and the package substrate PSUB and between the logic die SOC and the interposer substrate IPS. A second under-fill layer UF2 may be provided between the buffer die BC and the interposer substrate IPS. The first under-fill layer UF1 may encapsulate the first connection terminals IM1 and the second connection terminals IM2. The second under-fill layer UF2 may encapsulate the third connection terminals IM3. For example, the first and second under-fill layers UF1 and UF2 may each include or may be formed of a dielectric polymer, such as an epoxy-based polymer.

The first to fourth memory dies MC1 to MC4 may be dynamic random access memory (DRAM) chips. According to some embodiments, the first to fourth memory dies MC1 to MC4 may have substantially the same chip size. For example, the first to fourth memory dies MC1 to MC4 may have substantially the same planar shape and size.

Each of the first to fourth memory dies MC1 to MC4 may include a third substrate SUB3 and a third active layer ACL3 on the third substrate SUB3. The third active layer ACL3 may include memory transistors and a wiring layer on the memory transistors. Each of the first to fourth memory dies MC1 to MC4 may be mounted on the buffer die BC such that each of the first to fourth memory dies MC1 to MC4 may have a face down state in which the third active layer ACL3 faces the buffer die BC.

Each of the first, second, and third memory dies MC1, MC2, and MC3 may include through vias TV that penetrate therethrough. The fourth memory die MC4 may include no through via, but the present inventive concepts are not especially limited thereto. Micro-bumps MBP may be provided between the buffer die BC and the first memory die MC1, between the first memory die MC1 and the second memory die MC2, between the second memory die MC2 and the third memory die MC3, and between the third memory die MC3 and the fourth memory die MC4.

Third under-fill layers UF3 may be provided between the buffer die BC and the first memory die MC1, between the first memory die MC1 and the second memory die MC2, between the second memory die MC2 and the third memory die MC3, and between the third memory die MC3 and the fourth memory die MC4. The third under-fill layer UF3 may encapsulate the micro-bumps MBP. For example, the third under-fill layer UF3 may include or may be formed of a dielectric polymer, such as an epoxy-based polymer.

The micro-bumps MBP may be electrically connected to the through vias TV of the first to third memory dies MC1 to MC3. The through vias TV and the micro-bumps MBP may allow the first to fourth memory dies MC1 to MC4 to have electrical connection with the buffer die BC.

The buffer die BC of the memory stack structure SS may include a second physical-layer interface region PHY2. The wiring lines WL may electrically connect the first physical-layer interface region PHY1 of the logic die SOC to the second physical-layer interface region PHY2 of the buffer die BC. The logic die SOC and the buffer die BC may communicate data with each other. For example, the wiring lines WL of the interposer substrate IPS may constitute data lines through which data between the logic die SOC and the buffer die BC may be communicated.

A thermal radiation plate HS may be provided on the logic dies SOC and the memory stack structures SS. The thermal radiation plate HS may include a heat slug or a heat sink. For example, the thermal radiation plate HS may include or may be formed of a material, such as metal, whose thermal conductivity is high.

Figure 3A:
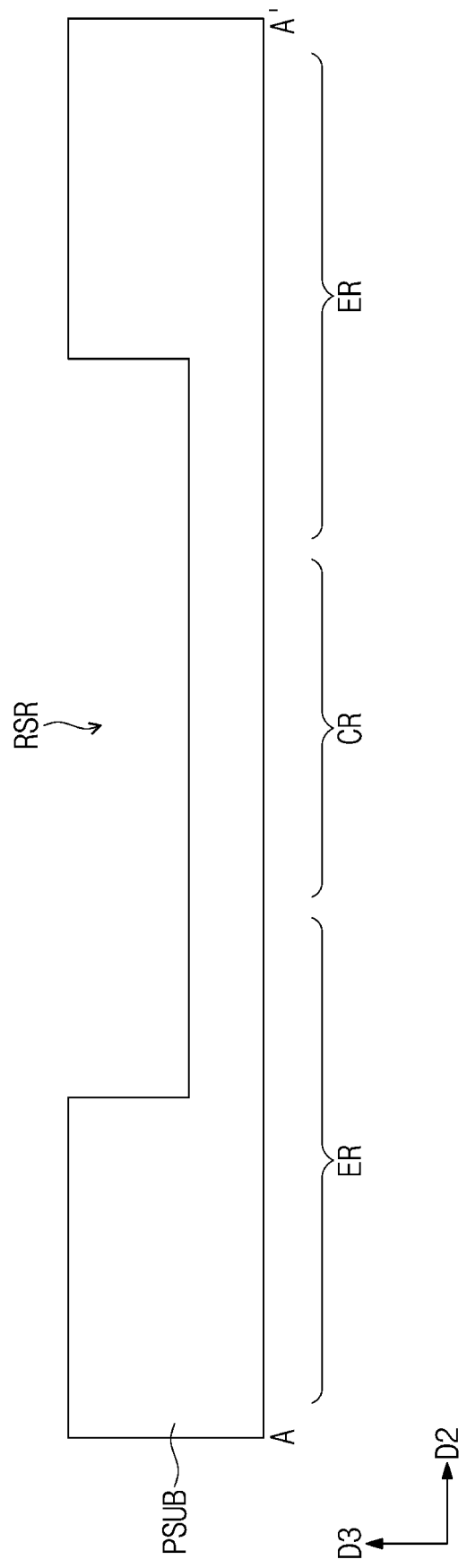
FIGS. 3A and 3B illustrate cross-sectional views taken along line A-A' of FIG. 1, showing a method of fabricating a semiconductor package according to some embodiments of the present inventive concepts.
Figure 3B:
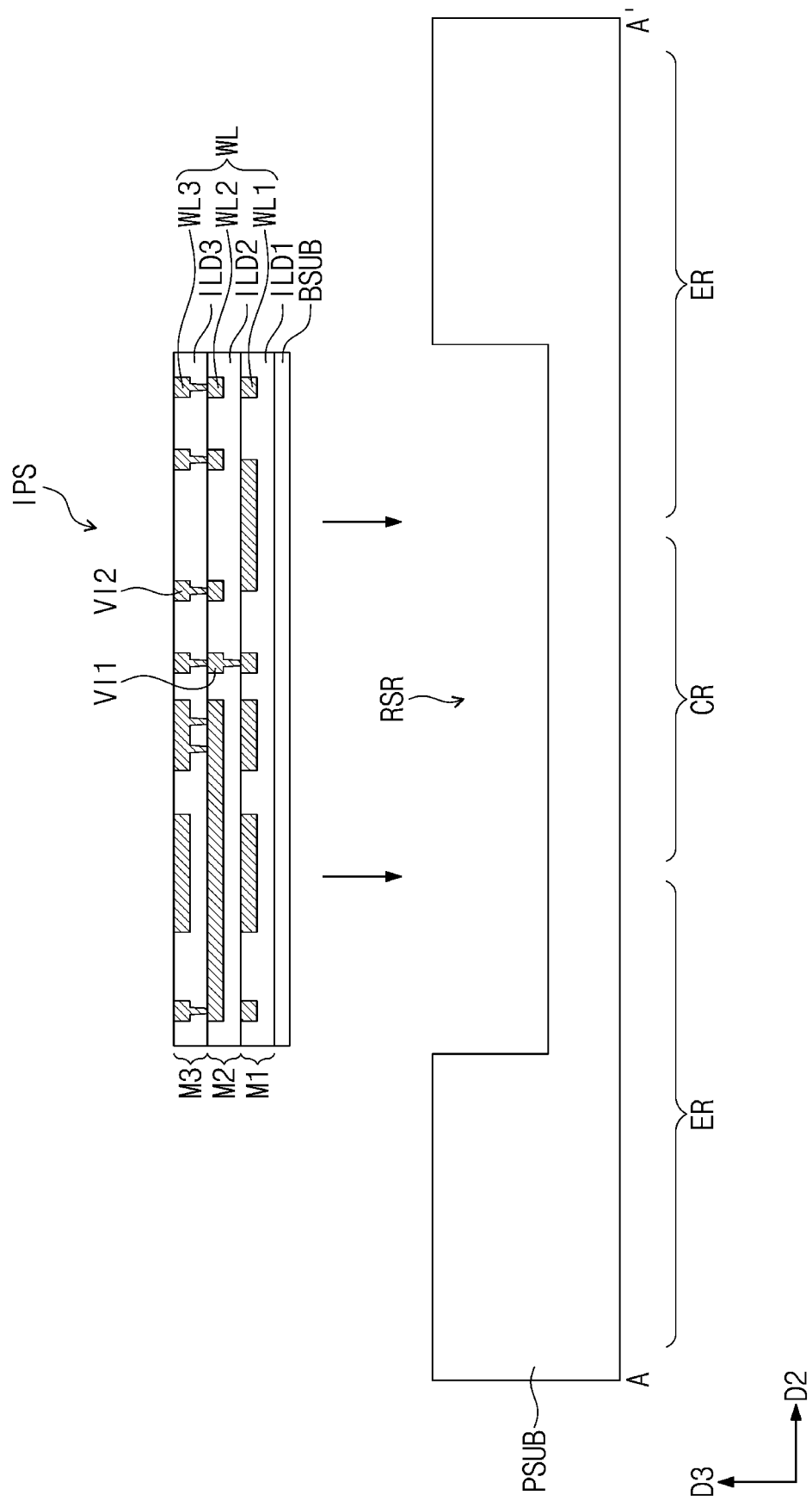

FIGS. 3A and 3B illustrate cross-sectional views taken along line A-A' of FIG. 1, showing a method of fabricating a semiconductor package according to some embodiments of the present inventive concepts.

Referring to FIG. 3A, a package substrate PSUB may be provided. For example, the package substrate PSUB may be a printed circuit board. Although not shown, the package substrate PSUB may include therein routing lines and at least one via. The package substrate PSUB may include edge regions ER and a central region CR between the edge regions ER. The edge regions ER may be areas positioned at opposite ends of the package substrate PSUB. The central region CR may be an area positioned at a central portion of the package substrate P SUB.

A recess region RSR may be formed on the package substrate PSUB. The recess region RSR of the package substrate PSUB may be an area that is recessed from a top surface of the package substrate PSUB. The recess region RSR of the package substrate PSUB may be positioned on the central portion of the package substrate PSUB.

Referring to FIG. 3B, an interposer substrate IPS may be formed. The interposer substrate IPS may include a base substrate BSUB, a first metal layer M1, a second metal layer M2, and a third metal layer M3 on the base substrate B SUB. The base substrate BSUB may be a semiconductor substrate. The metal layer M1, the second metal layer M2, and the third metal layer M3 may be sequentially stacked on the base substrate B SUB. The formation of the first metal layer M1 may include forming a first interlayer dielectric layer ILD1 and forming first wiring lines WL1 in the first interlayer dielectric layer ILD1. The formation of the second metal layer M2 may include forming a second interlayer dielectric layer ILD2 and forming second wiring lines WL2 and first vias VI1 in the second interlayer dielectric layer ILD2. The formation of the third metal layer M3 may include forming a third interlayer dielectric layer ILD3 and forming third wiring lines WL3 and second vias VI2 in the third interlayer dielectric layer ILD3. Each of the first, second, and third interlayer dielectric layers ILD1, ILD2, and ILD3 may include or may be formed of silicon oxide. Each of the first, second, and third wiring lines WL1, WL2, and WL3 may include or may be formed of a metallic material, such as one or more of copper, aluminum, tungsten, and titanium.

The interposer substrate IPS may be mounted on the package substrate PSUB. For example, the interposer substrate IPS may be inserted into the recess region RSR of the package substrate PSUB.

Referring back to FIG. 2, a dielectric film IF may be formed between side surfaces of the recess region RSR of the package substrate PSUB and the interposer substrate IPS. For example, an Ajinomoto build-up film (ABF) or a non-conductive film (NCF) may be used as the dielectric film IF.

Logic dies SOC and memory stack structures SS may be mounted on the package substrate PSUB. The logic dies SOC may be mounted on the edge regions ER of the package substrate PSUB, and the memory stack structures SS may be mounted on the central region CR of the package substrate PSUB.

First connection terminals IM1 may be formed between the logic die SOC and the package substrate PSUB. Second connection terminals IM2 may be formed between the logic die SOC and the interposer substrate IPS. Third connection terminals IM3 may be formed between the memory stack structure SS and the interposer substrate IPS. Pads PAD may be formed on lower portions of the first, second, and third connection terminals IM1, IM2, and IM3. A first under-fill layer UF1 may be formed to encapsulate the first and second connection terminals IM1 and IM2. A second under-fill layer UF2 may be formed to encapsulate the third connection terminals IM3. External terminals SB may be formed on a bottom surface of the package substrate PSUB. A thermal radiation plate HS may be formed on the logic dies SOC and the memory stack structures SS.

Figure 4:
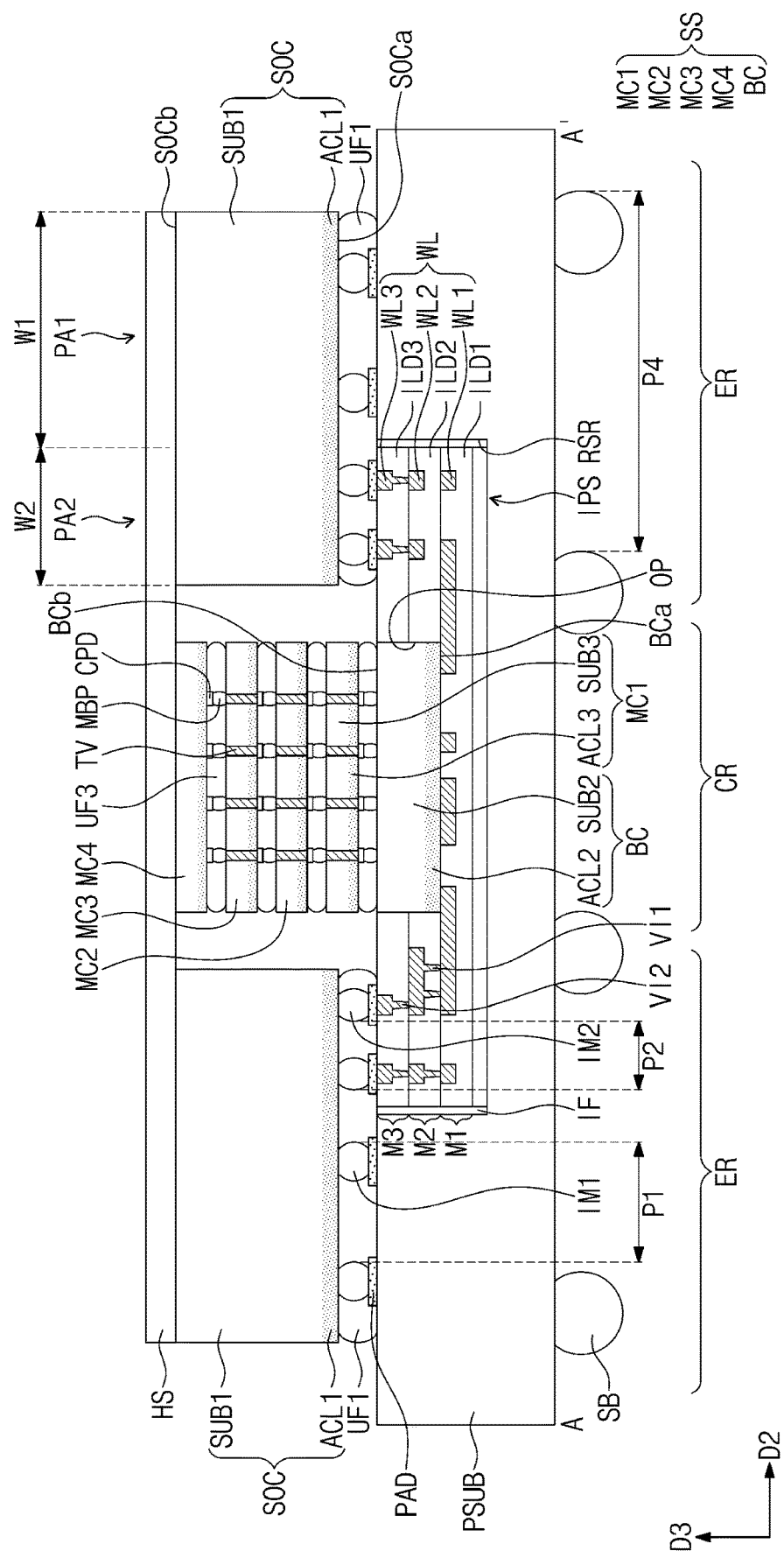
FIG. 4 illustrates a cross-sectional view taken along line A-A' of FIG. 1, showing a semiconductor device according to some embodiments of the present inventive concepts.

FIG. 4 illustrates a cross-sectional view taken along line A-A' of FIG. 1, showing a semiconductor device according to some embodiments of the present inventive concepts. In the embodiment that follows, a detailed description of technical features repetitive to those discussed above with reference to FIGS. 1 and 2 will be omitted, and a difference thereof will be explained in detail.

Referring to FIG. 4, the interposer substrate IPS may have an opening OP. The opening OP may be an area that is recessed from a top surface of the interposer substrate IPS. For example, the opening OP may expose a portion of the first interlayer dielectric layer ILD1.

The buffer die BC of the memory stack structure SS may be mounted in the interposer substrate IPS. For example, the buffer die BC may be inserted into the opening OP of the interposer substrate IPS. The second surface BCb of the buffer die BC may be located at substantially the same level as that of the top surface of the interposer substrate IPS. The second surface BCb of the buffer die BC may be located at substantially the same level as that of an uppermost surface of the package substrate PSUB. The first surface BCa of the buffer die BC may be located at substantially the same level as that of a top surface of the first interlayer dielectric layer ILD1. The third connection terminals IM3 discussed in FIGS. 1 and 2 may be omitted in this embodiment. The first surface BCa of the buffer die BC may be in contact with the first wiring lines WL1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Figure 5:
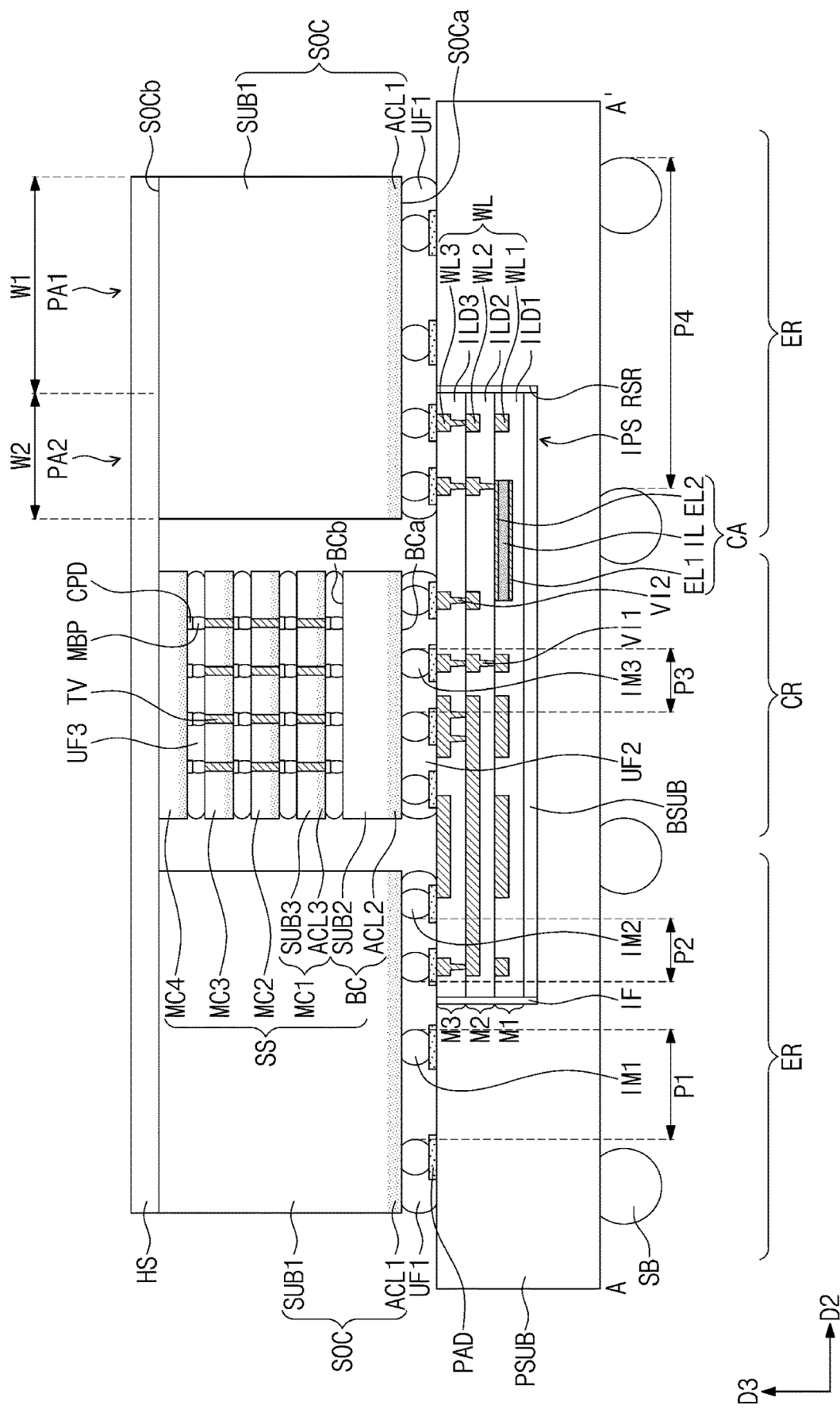
FIG. 5 illustrates a cross-sectional view taken along line A-A' of FIG. 1, showing a semiconductor device according to some embodiments of the present inventive concepts.

FIG. 5 illustrates a cross-sectional view taken along line A-A' of FIG. 1, showing a semiconductor device according to some embodiments of the present inventive concepts. In the embodiment that follows, a detailed description of technical features repetitive to those discussed above with reference to FIGS. 1 and 2 will be omitted, and a difference thereof will be explained in detail.

Referring to FIG. 5, the interposer substrate IPS may include a capacitor CA. For example, the capacitor CA may be provided in the first interlayer dielectric layer ILD1. The capacitor CA may include a first conductive layer EL1, a dielectric layer IL, and a second conductive layer EL2. The first conductive layer EL1 and the second conductive layer EL2 may be spaced apart from each other in the third direction D3. The dielectric layer IL may be provided between the first conductive layer EL1 and the second conductive layer EL2. The first conductive layer EL1, the dielectric layer IL, and the second conductive layer EL2 may be sequentially stacked in the third direction D3. For example, the capacitor CA may be electrically connected to the second metal layer M2. Although not shown, the interposer substrate IPS may include an inductor or a resistor.

Figure 6:
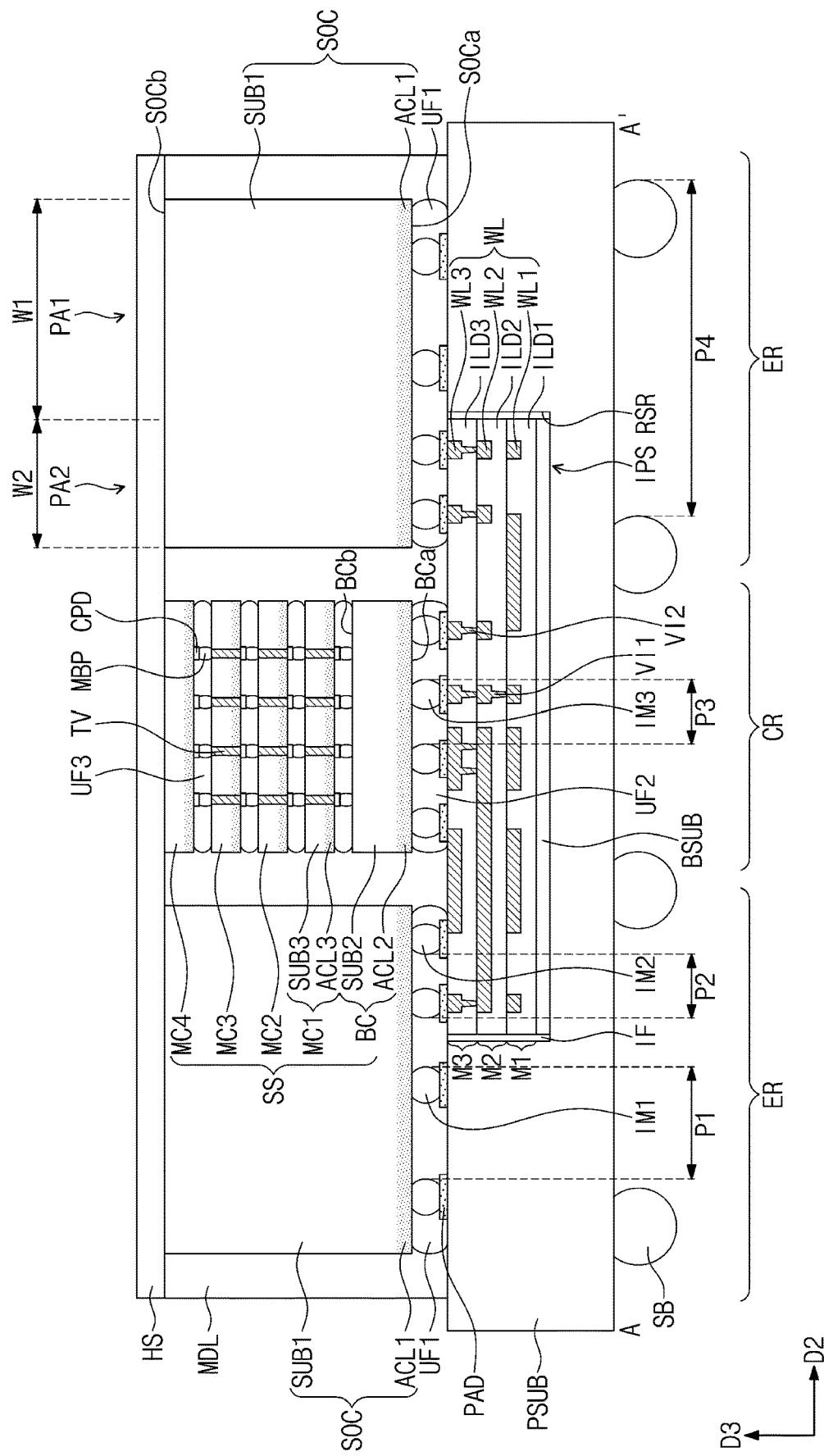
FIG. 6 illustrates a cross-sectional view taken along line A-A' of FIG. 1, showing a semiconductor package according to some embodiments of the present inventive concepts.

FIG. 6 illustrates a cross-sectional view taken along line A-A' of FIG. 1, showing a semiconductor package according to some embodiments of the present inventive concepts. In the embodiment that follows, a detailed description of technical features repetitive to those discussed above with reference to FIGS. 1 and 2 will be omitted, and a difference thereof will be explained in detail.

Referring to FIG. 6, a molding layer MDL may be provided on the package substrate PSUB. The molding layer MDL may cover sidewalls of the logic dies SOC and sidewalls of the memory stack structure SS. The molding layer MDL may expose top surfaces of the logic dies SOC and a top surface of the fourth memory die MC4 (i.e., the molding layer MDL may not cover top surfaces of the logic dies SOC and a top surface of the fourth memory die MC4). Alternatively, the molding layer MDL may further cover the top surfaces of the logic dies SOC and the top surface of the fourth memory die MC4. The molding layer MDL may include or may be formed of a dielectric polymer, such as an epoxy-based polymer.

The thermal radiation plate HS may be provided on the logic dies SOC and the memory stack structure SS. The thermal radiation plate HS may cover a top surface of the molding layer MDL. Although not shown, the thermal radiation plate HS may extend onto a sidewall of the molding layer MDL.

Figure 7:
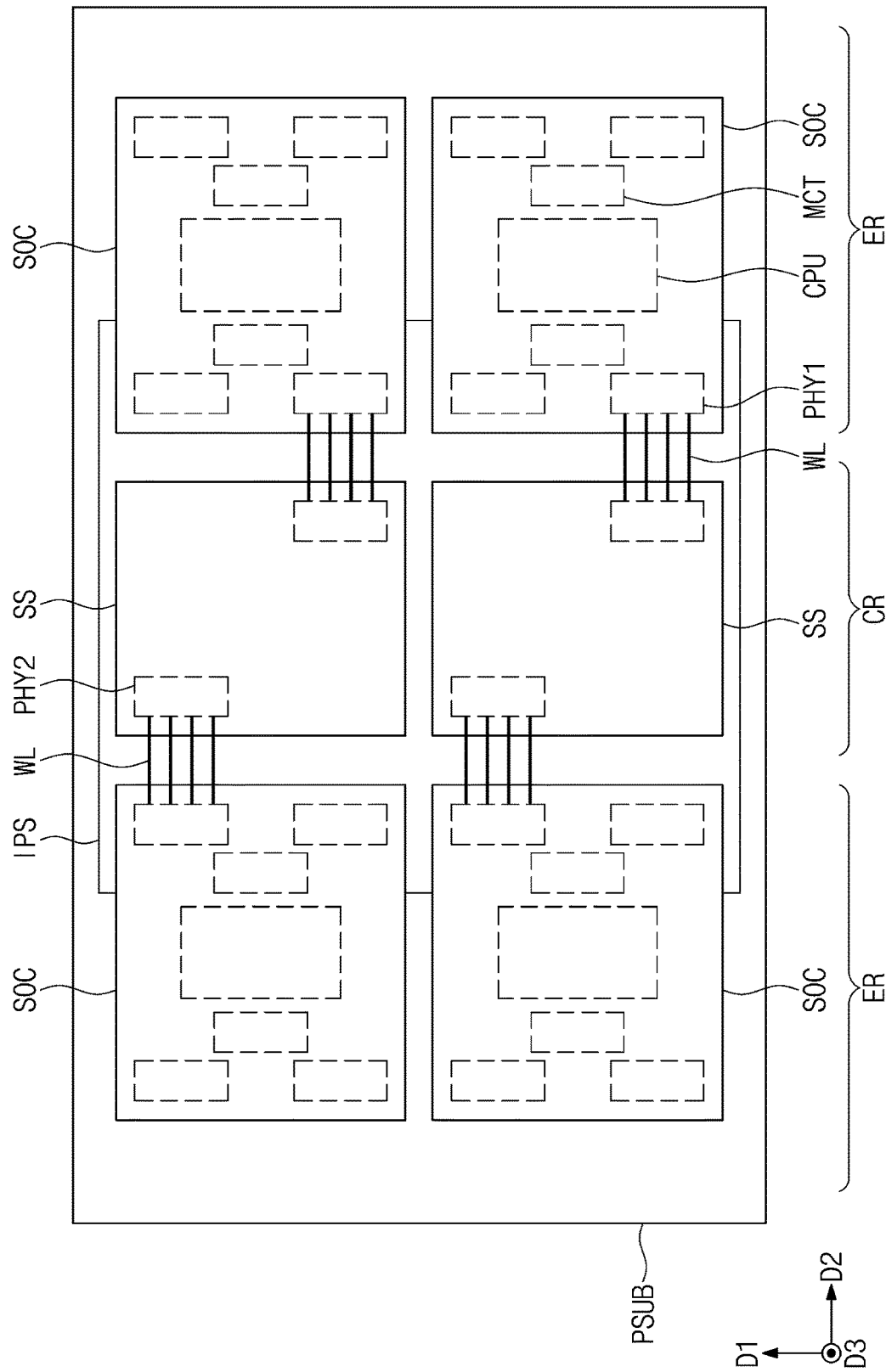
FIG. 7 illustrates a plan view showing a semiconductor package according to some embodiments of the present inventive concepts.

FIG. 7 illustrates a cross-sectional view showing a semiconductor package according to some example embodiments of the present inventive concepts. In the embodiment that follows, a detailed description of technical features repetitive to those discussed above with reference to FIG. 1 will be omitted, and a difference thereof will be discussed in detail.

Referring to FIG. 7, a single memory stack structure SS may be provided between the logic dies SOC that are adjacent to each other in the second direction D2. The memory stack structure SS may be electrically connected to a plurality of logic dies SOC that are adjacent to each other in the second direction D2. The memory stack structure SS may be electrically connected to the logic dies SOC through the wiring lines WL of the interposer substrate IP S.

A semiconductor package according to the present inventive concepts may include a memory stack structure provided on a central region of a package substrate. Because the central region is provided thereon with the memory stack structure whose size is less than that of a logic die, the package substrate may be prevented from warpage. As a result, the semiconductor package may increase in reliability.

A through via may not be included in an interposer substrate of the semiconductor package according to the present inventive concepts. Therefore, it may be possible to simplify fabrication processes of the semiconductor package and as a result to cut fabrication costs of the semiconductor package.

The package substrate may have therein the interposer substrate of the semiconductor package according to the present inventive concepts. The semiconductor package may thus decrease in thickness.

The memory stack structure of the semiconductor package according to the present inventive concepts may be electrically connected through the interposer substrate to the logic die, and the logic die may be electrically connected to the package substrate. Therefore, an electrical connection may be omitted between the interposer substrate and the package substrate.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
a package substrate that extends in a first direction and a second direction perpendicular to the first direction;
a plurality of logic dies and a memory stack structure on the package substrate; and
an interposer substrate mounted in the package substrate, wherein the entirety of the memory stack structure vertically overlaps the interposer substrate,
wherein each of the logic dies includes:
a first part that is horizontally offset from the interposer substrate; and
a plurality of first connection terminals that electrically connect the logic dies to the package substrate; and a plurality of second connection terminals that electrically connect the logic dies to the interposer substrate; and
a second part that vertically overlaps the interposer substrate,
wherein the interposer substrate includes:
an interlayer dielectric layer; and
a plurality of wiring lines in the interlayer dielectric layer, and
wherein the memory stack structure is electrically connected to at least one of the logic dies through the wiring lines of the interposer substrate,
wherein a bottom surface of the interposer substrate is in contact with the package substrate, and
wherein the interposer substrate does not include a conductive structure providing an electrical connection between the wiring lines of the interposer substrate and the bottom surface of the interposer substrate.

2. The semiconductor package of claim 1, wherein, when viewed in a plan view, the package substrate has a plurality of edge regions and a central region between the edge regions,
wherein the logic dies are on the edge regions, and
wherein the memory stack structure is on the central region.

3. The semiconductor package of claim 1, wherein
a width of the second part in the second direction has a value selected from a range of about 0.5 mm to about 5 mm, and
a width of the first part in the second direction is greater than the width of the second part in the second direction.

4. The semiconductor package of claim 1,
wherein a pitch between the first connection terminals is greater than a pitch between the second connection terminals.

5. The semiconductor package of claim 4, wherein
the pitch between the first connection terminals has a value selected from a range of about 50 μm to about 200 μm, and
the pitch between the second connection terminals has a value selected from a range of about 40 μm to about 50 μm.

6. The semiconductor package of claim 4, further comprising a plurality of third connection terminals that electrically connect the memory stack structure to the interposer substrate,
wherein a pitch between the third connection terminals is the same as the pitch between the second connection terminals.

7. The semiconductor package of claim 1, wherein the interposer substrate further includes a capacitor in the interlayer dielectric layer.

8. The semiconductor package of claim 1, wherein the memory stack structure includes:
a buffer die; and
a plurality of memory dies that are stacked on the buffer die,
wherein the buffer die is mounted in the interposer substrate.

9. The semiconductor package of claim 8, wherein a top surface of the buffer die is at the same level as a level of a top surface of the interposer substrate.

10. The semiconductor package of claim 1, further comprising a plurality of memory stack structures,
wherein, when viewed in plan, the plurality of memory stack structures are between the logic dies.

11. A semiconductor package, comprising:
a package substrate that extends in a first direction and a second direction perpendicular to the first direction and that includes, when viewed in a plan view, a plurality of edge regions and a central region between the edge regions;
a plurality of logic dies and a memory stack structure on the package substrate, the logic dies being on the edge regions, and the memory stack structure being on the central region;
an interposer substrate including wiring lines mounted in the package substrate, the wiring lines electrically connecting the memory stack structure to at least one of the logic dies;
a plurality of first connection terminals that electrically connect the logic dies to the package substrate;
a plurality of second connection terminals that electrically connect the logic dies to the interposer substrate; and
a plurality of third connection terminals that electrically connect the memory stack structure to the interposer substrate,
wherein a pitch between the first connection terminals is greater than a pitch between the second connection terminals,
wherein the pitch between the first connection terminals is greater than a pitch of the third connection terminals,
wherein a bottom surface of the interposer substrate is in contact with the package substrate,
wherein the interposer substrate does not include a conductive structure providing an electrical connection between the wiring lines of the interposer substrate and the bottom surface of the interposer substrate, and
wherein the entirety of the memory stack structure vertically overlaps the interposer substrate.

12. The semiconductor package of claim 11, wherein
the pitch between the first connection terminals has a value selected from a range of about 50 μm to about 200 μm, and
wherein the pitch between the second connection terminals and the pitch between the third connection terminals have a value selected from a range of about 40 μm to about 50 μm.

13. The semiconductor package of claim 11, wherein each of the logic dies includes:
a first part that is horizontally offset from the interposer substrate; and
a second part that vertically overlaps the interposer substrate,
wherein a width of the first part in the second direction is greater than a width of the second part in the second direction.

14. The semiconductor package of claim 11, further comprising a molding layer that covers sidewalls of the logic dies and sidewalls of the memory stack structure.

15. The semiconductor package of claim 11, further comprising a plurality of memory stack structures,
wherein the entirety of each of the plurality of memory stack structures vertically overlap the interposer substrate.

16. A semiconductor package, comprising:
a package substrate that extends in a first direction and a second direction perpendicular to the first direction and that includes a plurality of edge regions and a central region between the edge regions;
an interposer substrate mounted in the package substrate;
a dielectric film between the package substrate and the interposer substrate;

a plurality of logic dies on the plurality of edge regions of the package substrate;
a memory stack structure on the central region of the package substrate, the memory stack structure including a buffer die and a plurality of memory dies that are stacked on the buffer die;
a plurality of first connection terminals between the package substrate and the logic dies;
a plurality of second connection terminals between the interposer substrate and the logic dies;
a plurality of third connection terminals between the memory stack structure and the interposer substrate;
a plurality of pads on lower portions of the first, second, and third connection terminals;
an under-fill layer that encapsulates the first, second, and third connection terminals; and
a plurality of external terminals on a bottom surface of the package substrate,
wherein the interposer substrate includes:
a base substrate;
an interlayer dielectric layer on the base substrate;
a plurality of wiring lines in the interlayer dielectric layer; and
a plurality of vias in the interlayer dielectric layer, the plurality of vias electrically connecting the wiring lines to each other,
wherein the memory stack structure and at least one of the logic dies are electrically connected to each other through the wiring lines of the interposer substrate,
wherein the entirety of the memory stack structure vertically overlaps the interposer substrate,
wherein each of the logic dies includes:
a first part that is horizontally offset from the interposer substrate; and
a second part that vertically overlaps the interposer substrate,
wherein a bottom surface of the interposer substrate is in contact with the package substrate, and
wherein the interposer substrate does not include a conductive structure providing an electrical connection between the wiring lines of the interposer substrate and the bottom surface of the interposer substrate.

17. The semiconductor package of claim 16, wherein
a width of the second part in the second direction has a value selected from a range of about 0.5 mm to about 5 mm, and
a width of the first part in the second direction is greater than the width of the second part.

18. The semiconductor package of claim 16, wherein
a pitch between the first connection terminals is greater than a pitch between the second connection terminals and a pitch between the third connection terminals, and
a pitch between the external terminals is greater than the pitch between the first connection terminals.

19. The semiconductor package of claim 16, wherein the interposer substrate further includes a capacitor in the interlayer dielectric layer.

20. The semiconductor package of claim 16, further comprising:
a thermal radiation plate on the logic dies and the memory stack structure; and
a molding layer that covers sidewalls of the logic dies and sidewalls of the memory stack structure.

* * * * *